United States Patent
Tachibana et al.

(10) Patent No.: US 7,763,907 B2
(45) Date of Patent: Jul. 27, 2010

(54) SEMICONDUCTOR LIGHT EMITTING ELEMENT

(75) Inventors: Koichi Tachibana, Kawasaki (JP); Hajime Nago, Yokohama (JP); Shinji Saito, Yokohama (JP); Shinya Nunoue, Ichikawa (JP); Genichi Hatakoshi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 11/850,404

(22) Filed: Sep. 5, 2007

(65) Prior Publication Data

US 2008/0179623 A1    Jul. 31, 2008

(30) Foreign Application Priority Data

Jan. 25, 2007    (JP) .............................. 2007-014664

(51) Int. Cl.
  *H01L 33/22*    (2010.01)
  *H01L 33/14*    (2010.01)
  *H01L 33/38*    (2010.01)

(52) U.S. Cl. .................. 257/99; 257/103; 257/E33.065; 257/E33.074; 257/739; 257/628; 257/626; 257/745; 372/46.01

(58) Field of Classification Search ................ 257/9–39, 257/79–103, E33.001–E33.077, 623, 626, 257/627, 628, 739, 745, E21.09–E21.134; 372/45.01, 44.011, 46.01; 438/44, 42, 32, 438/604–609
See application file for complete search history.

(56) References Cited

U.S. PATENT DOCUMENTS

2001/0048113 A1* 12/2001 Kim .............................. 257/98
2003/0001238 A1* 1/2003 Ban ............................. 257/627
2004/0041156 A1* 3/2004 Tsuda et al. ................... 257/79
2004/0099859 A1* 5/2004 Nakahara et al. .............. 257/14
2005/0082562 A1* 4/2005 Ou et al. ...................... 257/103

(Continued)

FOREIGN PATENT DOCUMENTS

JP    2004-200431    7/2004

OTHER PUBLICATIONS

Daisuke Morita, et al., "Watt-Class High-Output-Power 365nm Ultraviolet Light-Emitting Diodes", Japanese Journal of Applied Physics, vol. 43, No. 9A, Sep. 9, 2004, pp. 5945-5950.

*Primary Examiner*—Matthew C Landau
*Assistant Examiner*—Aaron Staniszewski
(74) *Attorney, Agent, or Firm*—Oblon, Spivak, McClelland, Maier & Neustadt, L.L.P.

(57) ABSTRACT

A semiconductor light emitting element includes: an {0001} n-type semiconductor substrate formed of a III-V semiconductor, which is in a range of 0° to 45° in inclination angle into a <1-100> direction, and which is in a range of 0° to 10° in inclination angle into a <11-20> direction; an n-type layer formed of a III-V semiconductor on the n-type semiconductor substrate; an n-type guide layer formed of a III-V semiconductor above the n-type layer; an active layer formed of a III-V semiconductor above the n-type guide layer; a p-type first guide layer formed of a III-V semiconductor above the active layer; a p-type contact layer formed of a III-V semiconductor above the p-type first guide layer; and an concavo-convex layer formed of a III-V semiconductor between the p-type first guide layer and the p-type contact layer. The concavo-convex layer has concave portions and convex portions which are alternately and regularly arranged at a top face thereof, and has lower p-type impurity concentration than that of the p-type contact layer.

16 Claims, 6 Drawing Sheets

U.S. PATENT DOCUMENTS

| | | | |
|---|---|---|---|
| 2005/0221527 A1* | 10/2005 | Yeh et al. | 438/46 |
| 2005/0226295 A1* | 10/2005 | Taneya et al. | 372/45.01 |
| 2005/0279993 A1* | 12/2005 | Tamura et al. | 257/25 |
| 2006/0043419 A1* | 3/2006 | Tachibana et al. | 257/200 |
| 2007/0221929 A1* | 9/2007 | Lee et al. | 257/79 |
| 2007/0267640 A1* | 11/2007 | Lee et al. | 257/94 |
| 2008/0035936 A1* | 2/2008 | Lester | 257/79 |
| 2008/0067497 A1* | 3/2008 | Kim | 257/13 |
| 2008/0197369 A1* | 8/2008 | Batres et al. | 257/98 |
| 2009/0127574 A1* | 5/2009 | Bougrov et al. | 257/98 |

* cited by examiner

SEMICONDUCTOR LIGHT EMITTING ELEMENT

CROSS-REFERENCE TO RELATED APPLICATION

This application is based upon and claims the benefit of priority from prior Japanese Patent Application No. 2007-14664 filed on Jan. 25, 2007 in Japan, the entire contents of which are incorporated herein by reference.

BACKGROUND OF THE INVENTION

1. Field of the Invention

The present invention relates to a semiconductor light emitting element.

2. Related Art

In general, a nitride III-V compound semiconductor such as gallium nitride (GaN) is a semiconductor having a wideband gap. Making the most of its features, ultraviolet to blue and green light emitting diodes (LEDs) having a high luminance and blue-violet laser diodes (LDs) are under research and development.

For further raising the performance and efficiency of the semiconductor light emitting element, it is desired to lower the operation voltage of the semiconductor light emitting element. Typically, magnesium (Mg) is used as a p-type impurity for the nitride III-V compound semiconductor. Since the acceptor level of Mg is deep, however, Mg is hard to be activated as an acceptor. As a result, a voltage rise is brought about. It is important in lowering the operation voltage of the whole semiconductor light emitting element to lower the voltage in a p-type layer.

It is one technique to lower the voltage in a p-type contact layer as means for lowering the voltage in the p-type layer of the semiconductor light emitting element. The voltage acted on the contact layer depends upon contact resistance and series resistance. Above all, for lowering the contact resistance, it is desirable to increase the contact area for lowering the contact resistance.

It is proposed to provide an n-side layer with concavity and convexity in order to raise the light emitting efficiency if a light emitting diode (LED) (see, D. Morita, etc., "Watt-Class High-Output-Power 365 nm Ultraviolet Light-Emitting Diodes," Japanese Journal of Applied Physics, September 2004, Vol. 43, No. 9A, pp. 5945-5950).

For raising the light emission efficiency, however, it is desirable to provide the p-type layer side located nearer the active layer with concavity and convexity. If it is attempted to provide the p-type layer with concavity and convexity by using the etching process technique, however, there is a fear that even the active layer might be damaged because the layer thickness is thin and a sophisticated etching process technique is needed. In other words, forming a concavo-convex layer by using etching is apt to damage the semiconductor crystal, resulting in degraded characteristics of the semiconductor light emitting element.

SUMMARY OF THE INVENTION

The present invention has been made in view of these circumstances, and an object thereof is to provide a semiconductor light emitting element for which an operation voltage can be lowered without damaging the active layer.

A semiconductor light emitting element according to an aspect of the present invention includes: an {0001} n-type semiconductor substrate formed of a III-V semiconductor, which is in a range of 0° to 45° in inclination angle into a <1-100> direction, and which is in a range of 0° to 10° in inclination angle into a <11-20> direction; an n-type layer formed of a III-V semiconductor on the n-type semiconductor substrate; an n-type guide layer formed of a III-V semiconductor above the n-type layer; an active layer formed of a III-V semiconductor above the n-type guide layer; a p-type first guide layer formed of a III-V semiconductor above the active layer; a p-type contact layer formed of a III-V semiconductor above the p-type first guide layer; and a concavo-convex layer formed of a III-V semiconductor between the p-type first guide layer and the p-type contact layer, the concavo-convex layer having concave portions and convex portions which are alternately and regularly arranged at a top face thereof and having lower p-type impurity concentration than that of the p-type contact layer.

DETAILED DESCRIPTION OF THE INVENTION

Hereafter, embodiments of the present invention will be described in detail.

First Embodiment

Figure 1:
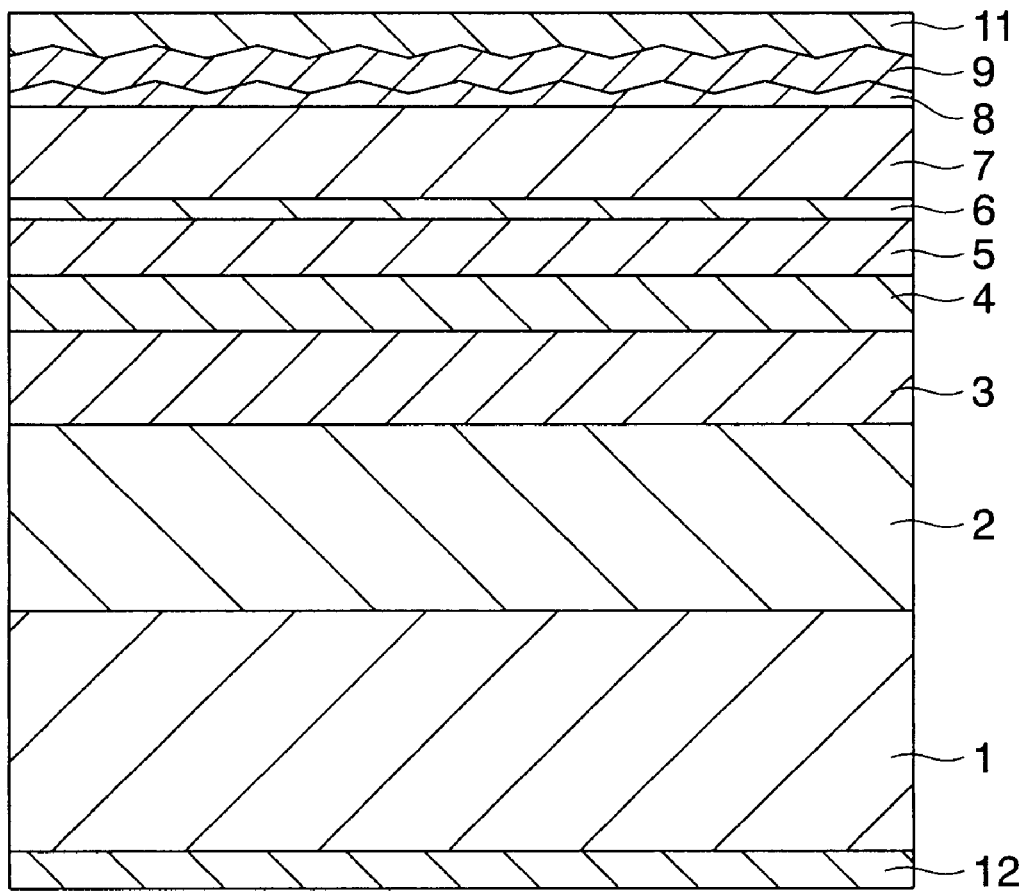
FIG. 1 is a sectional view of a semiconductor light emitting element according to a first embodiment.

A section of a semiconductor light emitting element according to a first embodiment of the present invention is shown in FIG. 1. The semiconductor light emitting element according to the present embodiment is a light emitting diode, which includes an n-type GaN layer 2 on a semiconductor substrate 1 formed of n-type GaN, an n-type guide layer 3 formed of n-type GaN on the n-type GaN layer 2, an active layer 4 formed on the n-type guide layer 3, a p-type guide layer 5 formed of p-type GaN on the active layer 4, an electron overflow prevention layer 6 formed of p-type GaAlN on the p-type guide layer 5, a p-type guide layer 7 formed of p-type GaN on the electron overflow prevention layer 6, a concavo-convex layer 8 formed on the p-type guide layer 7, and a contact layer 9 formed of p-type GaN on the concavo-convex layer 8. The concavo-convex layer 8 has concave portions and convex portions which are alternately and regularly arranged at a top face thereof. An electrode 11 is provided on the contact layer 9. An electrode 12 is provided on one side of the semiconductor substrate 1 opposite from the n-type GaN layer 2.

A method for manufacturing the semiconductor light emitting element according to the present embodiment will now be described.

In the manufacturing method according to the present embodiment, the above-described layers are formed on the semiconductor substrate 1 formed of n-type GaN by using crystal growth. For the crystal growth, for example, MOCVD (Metal Organic Chemical Vapor Deposition) is used. Besides, crystal growth may be conducted by using the MBE (Molecular Beam Epitaxy). As the n-type impurity, various elements such as Si or Ge can be used. In the present embodiment, however, Si is used. The doping level of Si should be set equal to approximately $2\times10^{18}$ cm$^{-3}$. In the semiconductor substrate 1 formed of n-type GaN used in the present embodiment, the above-described layers are formed on the {0001} plane. The {0001} plane should be in the range of 0° to 45° in an inclination angle into the <1-100> direction and in the range of 0° to 10° in an inclination angle into the <11-20> direction. Preferably, the {0001} plane should be in the range of 0° to 30° in an inclination angle into the <1-100> direction and in the range of 0° to 5° in an inclination angle into the <11-20> direction. More preferably, the {0001} plane should be in the range of 0° to 10° in an inclination angle into the <1-100> direction and in the range of 0° to 3° in an inclination angle into the <11-20> direction. In this case, it becomes possible to form the concavo-convex layer 8 described later. This aims at intentionally raising the step end density at which the crystal growth begins, by providing the substrate with an inclination angle. If the angle becomes great, the step end density also becomes high. However, it is not sufficient that there is simply an angle, but the inclination angle into the <1-100> direction should be in the range of 0° to 45°, preferably in the range of 0° to 30°, more preferably in the range of 0° to 10°. If the angle is too small, a step end density required to form the concavo-convex layer is not obtained, resulting in a planar film. Conversely, if the angle is too large, high quality crystal growth becomes difficult, and threading dislocation, stacking faults, or other defects occur. The same is true of the <11-20> direction as well, and the inclination angle should be in the range of 0° to 10°, preferably in the range of 0° to 5°, more preferably in the range of 0° to 3°.

The {0001} plane is a comprehensive representation of Miller indices including equivalent planes such as the (0001) plane or (000-1) plane. On the other hand, the <1-100> direction is Miller indices which collectively represent the whole of a direction group including [1-100], [10-10], [-1100], [-1010], [01-10] and [0-110] directions which are equivalent crystallographically caused by symmetry of the hexagonal system. The <11-20> direction is Miller indices which collectively represent the whole of a direction group including [11-20], [1-210], [-2110], [-1-120], [-12-10] and [2-1-10] directions. The [1-100] direction is a peculiar direction distinguished from the [10-10] direction which becomes rotationally symmetrical thereto. The [11-20] direction is Miller indices which mean a peculiar direction distinguished from the [11-20] and [2-1-10] directions which become rotationally symmetrical thereto. By the way, in the plane orientation or direction, a symbol "-" (bar) is used in association with its immediately following numeral.

The light emitting diode according to the present embodiment is fabricated by using the MOCVD method. As the raw materials, trimethylgallium (TMG), trimethylaluminum (TMA), trymethylindium (TMI) and biscyclopentadienyl magnesium (Cp$_2$Mg) are used. As the gas materials, ammonia (NH$_3$) and monosilane (SiH$_4$) are used. As carrier gas, hydrogen and nitrogen are used.

First, the semiconductor substrate 1 formed of n-type GaN processed by using organic cleaning and acid cleaning is led into a reaction chamber in an MOCVD equipment and disposed on a heated susceptor. Subsequently, in a process for raising the temperature up to 1100° C., thermal etching is performed and a natural oxide film formed on the surface is removed.

Subsequently, hydrogen and nitrogen are let flow as carrier gas. Thereafter, supply of TMG and SiH$_4$ is started, and the n-type GaN layer 2 is formed. Subsequently, the n-type guide layer 3 formed of GaN having a layer thickness of approximately 0.1 μm doped with an n-type impurity at a doping level of approximately $1\times10^{18}$ cm$^{-3}$ is subjected to crystal growth on the n-type GaN layer 2. The growth temperature which is set when each of the n-type GaN layer 2 and the n-type guide layer 3 is grown is in the range of 1000° C. to 1100° C. As the n-type guide layer 3, In$_{0.01}$Ga$_{0.99}$N having a layer thickness of approximately 0.1 μm may also be used instead of the n-type GaN. The growth temperature which is set when using the In$_{0.01}$Ga$_{0.99}$N layer is in the range of 700° C. to 800° C.

Subsequently, supply of TMG and SiH$_4$ is stopped, and the temperature is lowered into the range of 700° C. to 800° C. Supply of TMG and TMI is started, and the active layer 4 is formed on the n-type guide layer 3. The active layer 4 has an MQW (Multiple Quantum Well) structure obtained by stacking a plurality of stacked films each including a quantum well layer formed of undoped In$_{0.2}$Ga$_{0.8}$N having a layer thickness of approximately 3.5 nm and barrier layers provided on both sides of the quantum well layer and each formed of undoped In$_{0.01}$Ga$_{0.99}$N having a layer thickness of approximately 7 nm. In the design of the present embodiment, the wavelength of photoluminescence at the room temperature is set equal to 430 nm.

Subsequently, supply of TMG and TMI is stopped and the temperature is raised to a temperature in the range of 1000° C. to 1100° C. In this temperature state, supply of TMG and Cp$_2$Mg is started and the p-type guide layer 5 formed of p-type GaN is grown on the active layer 4. The layer thickness should be approximately 90 nm. In the present embodiment, Mg is used as a p-type impurity. Alternatively, various elements such as Zn can be used. The doping level of Mg is set equal to approximately $4\times10^{18}$ cm$^{-3}$. As the p-type guide layer 5, In$_{0.01}$Ga$_{0.99}$N having a layer thickness of approximately 0.1 μm may be used instead of the p-type GaN. When using In$_{0.01}$Ga$_{0.99}$N, the growth temperature should be in the range of 700° C. to 800° C.

Subsequently, in a state in which the temperature is kept in the range of 1000° C. to 1100° C., supply of TMA is started, and Ga$_{0.8}$Al$_{0.2}$N having a layer thickness of approximately 10 nm doped with a p-type impurity is grown on the p-type guide layer 5 as the electron overflow prevention layer 6. The doping level of Mg should be set equal to approximately $4\times10^{18}$ cm$^{-3}$.

In this state, supply of only TMA is stopped. A p-type guide layer 7 formed of p-type GaN and doped with Mg at a doping level of approximately $1\times10^{19}$ cm$^{-3}$ is grown on the electron overflow prevention layer 6. The p-type guide layer 7 is set to have a layer thickness of approximately 50 nm.

Subsequently, supply of TMG and Cp$_2$Mg is stopped and the temperature is lowered into the range of 700° C. to 800° C. Thereafter, in this temperature state, supply of TMI, TMA and TMG is started, and the concavo-convex layer 8 is formed of In$_x$Ga$_{1-x-y}$Al$_y$N (0<x<1, 0<y<1) on the p-type guide layer 7. In the present embodiment, the concavo-convex layer 8 has a facet of one of the {1-101} plane, the {1-102} plane, the {11-21} plane and the {11-22} plane, or a plane obtained by combining them. Here, the {1-101} plane, the {1-102} plane, the {11-21} plane and the {11-22} plane represent planes equivalent to the (1-101) plane, the (1-102) plane, the (11-21) plane and the (11-22) plane, respectively.

The present inventors have found that the growth temperature in the range of 700° C. to 800° C. is suitable for forming a concavo-convex layer having a facet of one of the {1-101} plane, the {1-102} plane, the {11-21} plane and the {11-22} plane, or a plane obtained by combining them. This is because the impurity is taken in remarkably and the element does not function if the growth is performed at temperatures below 700° C. On the other hand, it has been found that growth of the (0001) plane becomes dominant and a planar two-dimensional film is grown if the growth is performed at temperatures exceeding 800° C.

Furthermore, it has been found that a composition y of Al in $In_xGa_{1-x-y}Al_yN$ (0<x<1, 0<y<1) should be in the range of 0.001% to 6%, preferably in the range of 0.01% to 3%, more preferably in the range of 0.1% to 1%. Here, the composition y of Al is a value obtained from calculation by using an SIMS (Secondary Ion-microprobe Mass Spectrometry) or XRD (X-ray Diffraction). It has been found that if the composition y of Al is below 0.001% three-dimensional growth having a facet does not occur even when the growth temperature is in the range of 700° C. to 800° C. On the other hand, it has been found that if the composition y of Al in $In_xGa_{1-x-y}Al_yN$ (0<x<1, 0<y<1) exceeds 6% then three-dimensional growth occurs too much and consequently crystal defects are induced in the concavo-convex layer 8 and the element does not function as a semiconductor light emitting element. The composition x of In in $In_xGa_{1-x-y}Al_yN$ (0<x<1, 0<y<1) should be in the range of 1% to 20%, preferably in the range of 1% to 10%. This is because light generated in the quantum well layer is absorbed by the concavo-convex layer 8 if the composition x of In exceeds 20%. This is also caused by the fact that the crystal growth surface energy is changed to form the concavo-convex layer 8 because the inclination angle of the semiconductor substrate 1 formed of n-type GaN into the <1-100> direction is in the range of 0° to 45° and the inclination angle thereof into the <11-20> direction is in the range of 0° to 10°. By the way, the semiconductor substrate 1 must not have an inclination angle of 0° in both the <1-100> direction and the <11-20> direction. However, the inclination angle may be 0° in one of the <1-100> direction and the <11-20> direction.

The mol ratio of the five raw material to the three raw material at the time of crystal growth in the concavo-convex layer 8 should be in the range of 2000 to 40000, preferably in the range of 4000 to 20000. The minimum layer thickness of the concavo-convex layer 8 is preferably 10 nm. The distance between a convexity and its neighboring convexity or the distance between a concavity and its neighboring concavity should be in the range of 5 nm to 100 nm, preferably in the range of 10 nm to 80 nm, more preferably in the range of 20 nm to 60 nm. The height difference from a top of a convexity to a bottom of its neighboring concavity should be in the range of 5 nm to 200 nm, preferably in the range of 10 nm to 100 nm, more preferably in the range of 15 nm to 60 nm. When the sizes of the concavo-convex layer are in the ranges, it becomes possible to lower the operation voltage and improve the light takeout efficiency. If the thickness of the concavo-convex layer 8 is less than 10 nm, the concavity and convexity is not taken over by the top surface of the p-type contact layer 9 and the surface area of the p-type contact layer 9 does not increase. In the present embodiment, the concavo-convex layer 8 does not contain the p-type impurity Mg. However, the concavo-convex layer 8 may contain the p-type impurity Mg. In this case, it is necessary to supply, for example, $Cp_2Mg$ besides the raw material gases TMI, TMA and TMG when forming the concavo-convex layer 8.

After the concavo-convex layer 8 is formed, supply of TMG, TMI and TMA is stopped and the temperature is raised into the range of 1000° C. to 1100° C. Subsequently, the temperature is maintained, and supply of TMG and $Cp_2Mg$ is started. The p-type contact layer 9 formed of p-type GaN having a layer thickness of approximately 60 nm doped with Mg at a doping level of approximately $1\times10^{20}$ cm$^{-3}$ is grown on the concavo-convex layer 8. Since the layer thickness of the p-type contact layer 9 is as thin as 60 nm, the facet and roughness of the concavo-convex layer 8 are taken over as they are by the p-type contact layer 9 as well. Therefore, the surface area of the p-type contact layer 9, i.e., the area of contact with the electrode 11 increases, resulting in a lowered operation voltage. By the way, for example, $In_{0.01}Ga_{0.99}N$ may be used instead of p-type GaN as the p-type contact layer 9. In the case where InGaN is grown, the growth temperature is in the range of 700° C. to 800° C. In a p-type contact layer formed of a facet of one of the {1-101} plane, the {1-102} plane, the {11-21} plane and the {11-22} plane, or a plane obtained by combining them, compensation donor is hard to be formed and the acceptor concentration has risen as compared with the p-type contact layer on the (0001) plane even if it is doped with a p-type impurity of the same quantity. This leads to further lowering of the operation voltage.

A light emitting diode is finally fabricated by conducting the following device process on the wafer subjected to the crystal growth.

The electrode 11 is formed of a composite film of, for example, palladium-platinum-gold (Pd/Pt/Au) on the p-type contact layer 9 formed of p-type GaN. For example, Pd is 0.05 μm in film thickness, Pt is 0.05 μm in film thickness, and Au is 0.05 μm in film thickness. By the way, the electrode 11 may be a transparent electrode which transmits light and which is formed of, for example, ITO.

After the electrode 11 is formed, it is polished from the n-type GaN substrate 1 side and the wafer thickness is made as thin as approximately 100 μm. Thereafter, the electrode 12 is formed. The electrode 12 is formed of, for example, a composite film of titanium-platinum-gold (Ti/Pt/Au). As for the film thickness, for example, the Ti film is approximately 0.05 μm in film thickness, the Pt film is approximately 0.05 μm in film thickness, and the Au film is approximately 1.0 μm in film thickness.

In the present embodiment, concavity and convexity obtained by taking over the concavity and convexity of the concavo-convex layer 8 is formed on the surface of the p-type contact layer 9 as heretofore described. Since an etching process is not used in forming the concavity and convexity of the concavo-convex layer, however, the active layer is not damaged.

Figure 2:
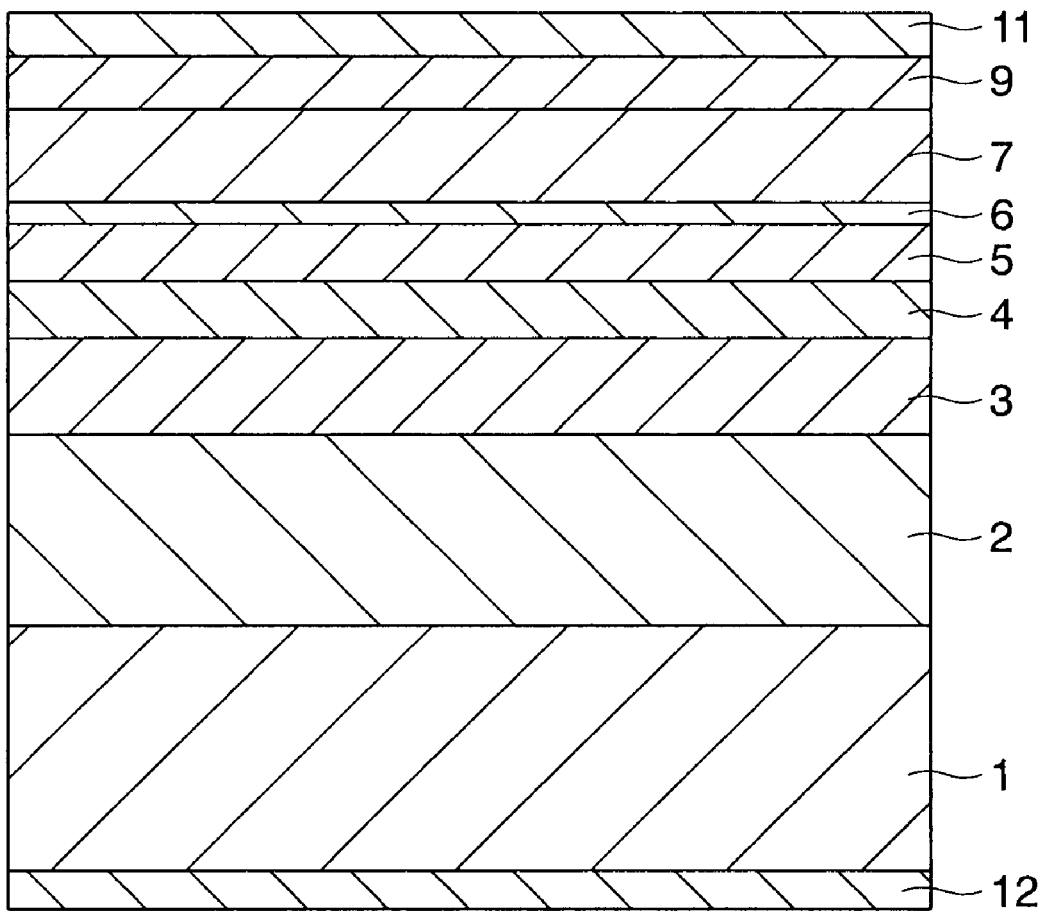
FIG. 2 is a sectional view of a semiconductor light emitting element according to a comparative example of the first embodiment.

Subsequently, a light emitting diode shown in FIG. 2 is fabricated as a comparative example. The light emitting diode in this comparative example has a configuration obtained from that of the light emitting diode in the present embodiment by forming the p-type contact layer 9 on the p-type guide layer 7 without forming the concavo-convex layer 8.

Characteristics of the blue light emitting diode according to the present embodiment are compared with characteristics of the light emitting diode of the comparative example. In the light emitting diode of the comparative example, the operation voltage is 3.2 V and the optical output is 15 mW at an operation current of 20 mA.

On the other hand, in the light emitting diode according to the present embodiment, the operation voltage reaches 3.0 V and the optical output reaches 20 mW at an operation current of 20 mA. It is considered that the reason why the operation voltage can be lowered in the present embodiment is that the contact area between the p-type contact layer 9 and the electrode 11 is increased and the contact resistance is decreased as compared with the comparative example. Furthermore, in the present embodiment, the interface between the electrode 11 and the p-type contact layer 9 has concavity and convexity having sizes in the above-described ranges, and consequently diffused reflection of light is suppressed and the optical output increases.

According to the present embodiment, the operation voltage can be lowered without damaging the active layer as heretofore described.

Second Embodiment

Figure 3:
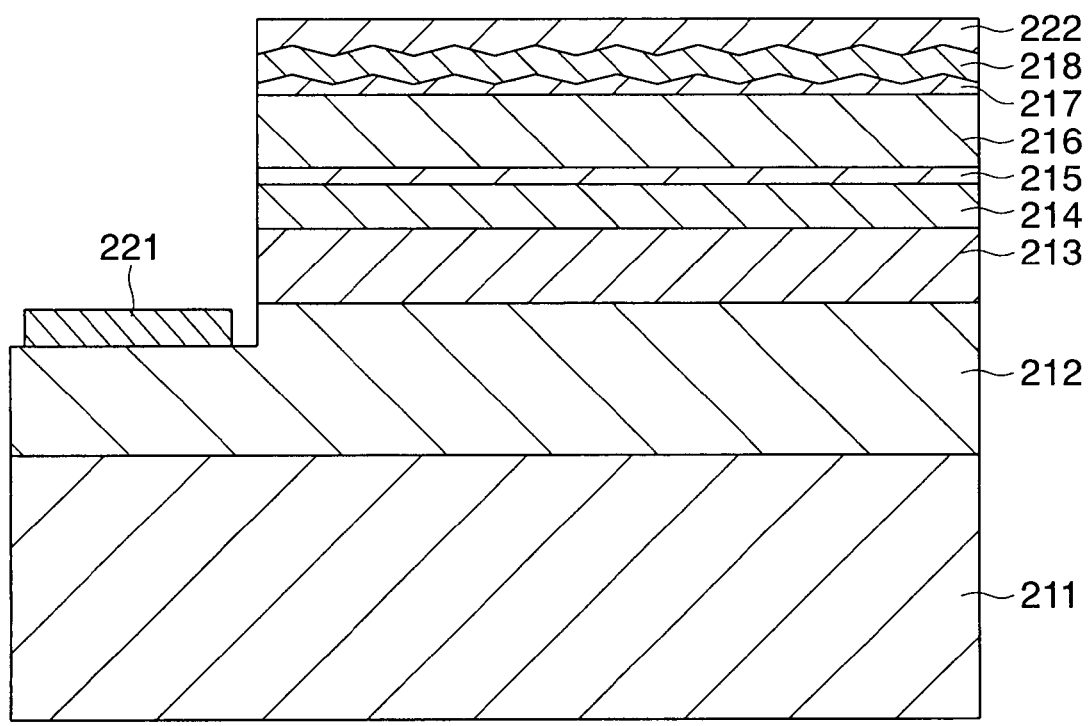
FIG. 3 is a sectional view of a semiconductor light emitting element according to a second embodiment.

A section of a semiconductor light emitting element according to a second embodiment of the present invention is shown in FIG. 3. The semiconductor light emitting element according to the present embodiment is a nitride semiconductor light emitting diode. It has a stacked structure obtained by stacking a contact layer 212 formed of n-type GaN, an n-type guide layer 213 formed of n-type GaN, an active layer 214 having a MQW (Multiple Quantum Well) structure formed of InGaN, an electron overflow prevention layer 215 formed of p-type GaAlN, a p-type guide layer 216 formed of p-type GaN, a concavo-convex layer 217 formed of InGaAlN, and a contact layer 218 formed of p-type GaN successively on a semiconductor substrate 211 formed on n-type GaN. The concavo-convex layer 217 has concave portions and convex portions which are alternately and regularly arranged at a top face thereof.

A part of the multilayer structure extending from the contact layer 218 formed of p-type GaN to the contact layer 212 formed of n-type GaN is removed to expose a part of the contact layer 212. An electrode 221 is formed of Ti/Pt/Au on the exposed part of the contact layer 212. A reflection electrode 222 is formed of Ag on the surface of the contact layer 218 formed of p-type GaN. The reflection electrode 222 is provided to reflect light generated from the active layer and take out light efficiently.

A method for manufacturing the light emitting diode according to the present embodiment will now be described.

The light emitting diode according to the present embodiment is fabricated by using the MOCVD method. As raw materials, TMG, TMA, TMI and $Cp_2Mg$ are used. As gas raw materials, ammonia $NH_3$ and $SiH_4$ are used. In addition, hydrogen and nitrogen are used as carrier gas.

First, the semiconductor substrate 211 formed of n-type GaN processed by organic cleaning and acid cleaning is led into a reaction chamber in a MOCVD equipment, and disposed on a heated susceptor. Subsequently, thermal etching is conducted in a process of raising temperature to 1100°, and a natural oxide film formed on the surface is removed. In the semiconductor substrate 211 formed of GaN used in the present embodiment, the above-described layers are formed on the {0001} plane. The {0001} plane should be in the range of 0° to 45° in inclination angle into the <1-100> direction and in the range of 0° to 10° in inclination angle into the <11-20> direction. Preferably, the {0001} plane should be in the range of 0° to 30° in inclination angle into the <1-100> direction and in the range of 0° to 5° in inclination angle into the <11-20> direction. More preferably, the {0001} plane should be in the range of 0° to 10° in inclination angle into the <1-100> direction and in the range of 0° to 3° in inclination angle into the <11-20> direction. In this case, it becomes possible to form a concavo-convex layer 217 which will be described later, in the same way as the first embodiment.

Subsequently, hydrogen and nitrogen are let flow as carrier gas. Thereafter, supply of TMG and $SiH_4$ is started, and the contact layer 212 is formed of n-type GaN. Here, the growth temperature is in the range of 1000° C. to 1100° C. Subsequently, the guide layer 213 formed of n-type GaN is grown. The growth temperature of the guide layer 213 formed of n-type GaN is also set in the range of 1000° C. to 1100° C.

Subsequently, supply of TMG and $SiH_4$ is stopped, and the temperature is lowered into the range of 700° C. to 800° C. In this temperature state, supply of TMG and TMI is started. An active layer 214 having an MQW (Multiple Quantum Well) structure is formed of InGaN by stacking a plurality of stacked films each including a quantum well layer formed of undoped $In_{0.2}Ga_{0.8}N$ having a layer thickness of approximately 3.5 nm and barrier layers provided on both sides of the quantum well layer and each formed of undoped $In_{0.01}Ga_{0.99}N$ having a layer thickness of approximately 7 nm.

Subsequently, supply of TMG and TMI is stopped and the temperature is raised to a temperature in the range of 1000° C. to 1100° C. Subsequently, the temperature is maintained, supply of TMG, TMA and $Cp_2Mg$ is started to form the electron overflow prevention layer 215 of p-type GaAlN. Subsequently, from this state, only supply of TMA is stopped and the guide layer 216 is formed of p-type GaN.

Subsequently, supply of TMG and $Cp_2Mg$ is stopped and the temperature is lowered into the range of 700° C. to 800° C. Thereafter, supply of TMI, TMA and TMG is started, and in this temperature state, the concavo-convex layer 217 is formed of $In_xGa_{1-x-y}Al_yN$ (0<x<1, 0<y<1). Here, the concavo-convex layer 217 has a facet of one of the {1-101} plane, the {1-102} plane, the {11-21} plane and the {11-22} plane, or a plane obtained by combining them. Furthermore, it has been found that a composition y of Al in the concavo-convex layer 217 formed of $In_xGa_{1-x-y}Al_yN$ (0<x<1, 0<y<1) should be in the range of 0.001% to 6%, preferably in the range of 0.01% to 3%, more preferably in the range of 0.1% to 1%. The minimum layer thickness of the concavo-convex layer 217 is preferably 10 nm. The distance between a convexity and its neighboring convexity or the distance between a concavity and its neighboring concavity should be in the range of 5 nm to 100 nm, preferably in the range of 10 nm to 80 nm, more preferably in the range of 20 nm to 60 nm. The height difference from a top of a convexity to a bottom of its neighboring concavity should be in the range of 5 nm to 200 nm, preferably in the range of 10 nm to 100 nm, more preferably in the range of 15 nm to 60 nm. When the sizes of the concavo-convex layer are in the ranges, it becomes possible to lower the operation voltage and improve the light takeout efficiency. In the present embodiment, the concavo-convex layer 217 does not contain the p-type impurity Mg. However, the concavo-convex layer 217 may contain the p-type impurity Mg. In this case, it is necessary to supply, for example, $Cp_2Mg$ besides the raw material gases TMI, TMA and TMG when forming the concavo-convex layer 217.

Subsequently, supply of TMG, TMI and TMA is stopped and the temperature is raised into the range of 1000° C. to 1100° C. Subsequently, the temperature is maintained, and supply of TMG and $Cp_2Mg$ is started to form the contact layer 218 formed of p-type GaN. And supply of an organic metal raw material is stopped, and only $NH_3$ and carrier gas are supplied continuously, and the temperature is lowered.

Subsequently, a part of the multilayer structure is removed by using the dry etching method until the contact layer 212 formed of n-type GaN is reached. The electrode 221 is formed of Ti/Pt/Au on the exposed n-type contact layer 212. The electrode 222 is formed of Ag on the contact layer 218 formed of p-type GaN.

Subsequently, a flip chip structure is formed by inverting and mounting the above-described multilayer structure.

In the present embodiment, concavity and convexity obtained by taking over the concavity and convexity of the concavo-convex layer 217 is formed on the surface of the p-type contact layer 218 as heretofore described. Since an etching process is not used in forming the concavity and convexity of the concavo-convex layer 217, however, the active layer is not damaged.

I-V characteristics of the light emitting diode according to the present embodiment are measured. As a result, favorable ohmic contact is obtained. When the operation current is 20 mA, the operation voltage of the light emitting diode becomes 3.0 V and the optical output becomes 30 mW.

Thus, according to the present embodiment, it becomes possible to insert the InGaAlN layer having the concavo-convex structure in the crystal growth process without a process of forming concavity and convexity on the surface serving as a light takeout part or at a crystal interface of the semiconductor substrate 211. It becomes possible to obtain effects better than those of the conventional art without reducing the light takeout effect by the working precision.

In the present embodiment, GaN is used as the semiconductor substrate. However, it is also possible to use sapphire, SiC or ZnO instead. Furthermore, it is also possible to apply the vertical energization structure as the shape of the light emitting diode.

According to the present embodiment, the operation voltage can be lowered without damaging the active layer as heretofore described.

Third Embodiment

Figure 4:
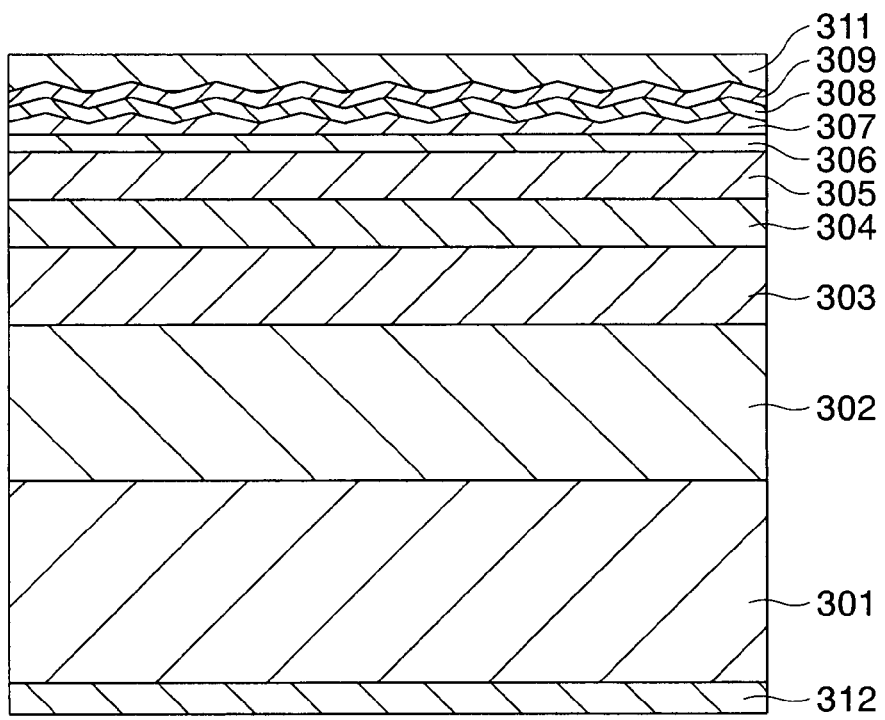
FIG. 4 is a sectional view of a semiconductor light emitting element according to a third embodiment.

A section of a semiconductor light emitting element according to a third embodiment of the present invention is shown in FIG. 4. The semiconductor light emitting element according to the present embodiment is a light emitting diode, which includes an n-type GaN layer 302 formed on a semiconductor substrate 301 formed of n-type GaN, an n-type guide layer 303 formed of n-type GaN on the n-type GaN layer 302, an active layer 304 having an MQW (Multiple Quantum Well) structure formed on the n-type guide layer 303, a p-type guide layer 305 formed of p-type GaN on the active layer 304, an electron overflow prevention layer 306 formed of p-type GaAlN on the p-type guide layer 305, a concavo-convex layer 307 formed on the electron overflow prevention layer 306, a p-type guide layer 308 formed of p-type GaN on the concavo-convex layer 307, and a contact layer 309 formed of p-type GaN on the p-type guide layer 308. The concavo-convex layer 307 has concave portions and convex portions which are alternately and regularly arranged at a top face thereof. An electrode 311 is provided on the contact layer 309. An electrode 312 is provided on one side of the semiconductor substrate 301 opposite from the n-type GaN layer 302.

A method for manufacturing the semiconductor light emitting element according to the present embodiment will now be described.

First, the n-type GaN layer 302 doped with an n-type impurity is formed on the semiconductor substrate 301 formed of n-type GaN by crystal growth. For the crystal growth, the MOCVD method is used. As the n-type impurity, various elements such as Si or Ge can be used. In the present embodiment, however, Si is used. The doping level of Si is set equal to approximately $2 \times 10^{18}$ cm$^{-3}$. In the n-type GaN semiconductor substrate 301 used in the present embodiment, the above-described layers are formed on the {0001} plane. The {0001} plane should be in the range of 0° to 45° in an inclination angle into the <1-100> direction and in the range of 0° to 10° in an inclination angle into the <11-20> direction. Preferably, the {0001} plane should be in the range of 0° to 30° in an inclination angle into the <1-100> direction and in the range of 0° to 5° in an inclination angle into the <11-20> direction. More preferably, the {0001} plane should be in the range of 0° to 10° in an inclination angle into the <1-100> direction and in the range of 0° to 3° in an inclination angle into the <11-20> direction. In this case, it becomes possible to form the concavo-convex layer 307 described later.

Subsequently, the n-type guide layer 303 having a layer thickness of approximately 0.1 μm doped with an n-type impurity at a doping level of approximately $1 \times 10^{18}$ cm$^{-3}$ is formed of GaN on the n-type GaN layer 302 by crystal growth. The growth temperature at the time when each of the n-type GaN layer 302 and the n-type guide layer 303 is grown is in the range of 1000° C. to 1100° C. As the n-type guide layer 303, $In_{0.01}Ga_{0.99}N$ having a layer thickness of approximately 0.1 μm may be used instead of the n-type GaN. When using $In_{0.01}Ga_{0.99}N$, the growth temperature is in the range of 700° C. to 800° C.

Subsequently, the active layer 304 having an MQW (Multiple Quantum Well) structure is formed by stacking a plurality of stacked films each including a quantum well layer formed of undoped $In_{0.2}Ga_{0.8}N$ having a layer thickness of approximately 3.5 nm and barrier layers provided on both sides of the quantum well layer and each formed of undoped $In_{0.01}Ga_{0.99}N$ having a layer thickness of approximately 7 nm. In this case, the growth temperature is in the range of 700° C. to 800° C. In the design, the wavelength of photoluminescence at the room temperature is set equal to 430 nm.

Subsequently, the p-type guide layer 305 formed of p-type GaN is grown on the active layer 304. The layer thickness should be approximately 90 nm. The temperature at which GaN is grown is in the range of 1000° C. to 1100° C. As the p-type impurity, various elements such as Mg and Zn can be used. In the present embodiment, Mg is used. The doping level of Mg is set equal to approximately $4 \times 10^{18}$ cm$^{-3}$. As the p-type guide layer 305, $In_{0.01}Ga_{0.99}N$ having a layer thickness of approximately 0.1 μm may be used instead of the p-type GaN. When using $In_{0.01}Ga_{0.99}N$, the growth temperature is in the range of 700° C. to 800° C.

Subsequently, the electron overflow prevention layer 306 formed of $Ga_{0.8}Al_{0.2}N$ having a layer thickness of approximately 10 nm doped with a p-type impurity is grown on the p-type guide layer 305. The doping level of Mg is set equal to approximately $4 \times 10^{18}$ cm$^{-3}$. The growth temperature of $Ga_{0.8}Al_{0.2}N$ is in the range of 1000° C. to 1100° C. However, the growth temperature of $Ga_{0.8}Al_{0.2}N$ may be set in the range of 700° C. to 800° C.

The concavo-convex layer 307 is formed of $In_xGa_{1-x-y}Al_yN$ (0<x<1, 0<y<1) on the electron overflow prevention layer 306. In the same way as the first embodiment, the growth temperature is lowered into the range of 700° C. to 800° C. again to cause growth before the formation of the concavo-convex layer 307. In the present embodiment, the concavo-convex layer 307 has a facet of one of the {1-101} plane, the {1-102} plane, the {11-21} plane and the {11-22} plane, or a plane obtained by combining them. A composition y of Al in the concavo-convex layer 307 formed of $In_xGa_{1-x-y}Al_yN$ (0<x<1, 0<y<1) should be in the range of 0.001% to 6%, preferably in the range of 0.01% to 3%, more preferably in the range of 0.1% to 1%. The minimum layer thickness of the concavo-convex layer 307 is preferably 10 nm. The distance between a convexity and its neighboring convexity or the distance between a concavity and its neighboring concavity should be in the range of 5 nm to 100 nm, preferably in the range of 10 nm to 80 nm, more preferably in the range of 20 nm to 60 nm. The height difference from a top of a convexity to a bottom of its neighboring concavity should be in the range of 5 nm to 200 nm, preferably in the range of 10 nm to 100 nm, more preferably in the range of 15 nm to 60 nm. When the sizes of the concavo-convex layer are in the ranges, it becomes possible to lower the operation voltage and improve the light takeout efficiency.

Subsequently, the p-type guide layer 308 formed of p-type GaN doped with Mg at a doping level of approximately $1\times10^{19}$ cm$^{-3}$ is grown on the concavo-convex layer 307. The layer thickness should be approximately 50 nm. The temperature at which GaN is grown is in the range of 1000° C. to 1100° C.

Finally, the contact layer 309 formed of p-type GaN having a layer thickness of 60 nm doped with Mg at a doping level of approximately $1\times10^{20}$ cm$^{-3}$ is grown on the concavo-convex layer 307. Since the sum of layer thicknesses of the p-type guide layer 308 and the contact layer 309 is as thin as 110 nm, the facet and roughness of the concavo-convex layer 307 are taken over intact by the p-type guide layer 308 and the contact layer 309. Therefore, the contact area between the contact layer 309 and the electrode 311 increases and the operation voltage can be lowered. Here, the temperature at which GaN is grown is in the range of 1000° C. to 1100° C. As the contact layer 309, for example, $In_{0.01}Ga_{0.99}N$ may be used instead of the GaN. When $In_{0.01}Ga_{0.99}N$ is grown, the growth temperature is in the range of 700° C. to 800° C. In the stacked film of the p-type guide layer 308 and the contact layer 309 formed on a facet of one of the {1-101} plane, the {1-102} plane, the {11-21} plane and the {11-22} plane, or a plane obtained by combining them, compensation donor is hard to be formed and the acceptor concentration has risen as compared with the p-type contact layer formed on the (0001) plane even if it is doped with a p-type impurity of the same quantity. Therefore, the operation voltage can be further lowered.

In the present embodiment, concavity and convexity obtained by taking over the concavity and convexity of the concavo-convex layer 307 is formed on the surface of the p-type contact layer 309 as heretofore described. Since an etching process is not used in forming the concavity and convexity of the concavo-convex layer 307, however, the active layer is not damaged.

The light emitting diode is finally fabricated by conducting device processes described hereafter on the wafer subjected to the crystal growth.

The electrode 311 is formed of a composite film of, for example, palladium-platinum-gold (Pd/Pt/Au) on the p-type GaN contact layer 309. For example, the Pd film is 0.05 μm in film thickness, the Pt film is 0.05 μm in film thickness, and the Au film is 0.05 μm in film thickness.

After the electrode 311 is formed, it is polished from the semiconductor substrate 301 side formed of n-type GaN and the wafer thickness is made as thin as approximately 100 μm. Thereafter, the electrode 312 is formed. The electrode 312 is formed of, for example, a composite film of titanium-platinum-gold (Ti/Pt/Au). As for the film thickness, for example, the Ti film is approximately 0.05 μm in film thickness, the Pt film is approximately 0.05 μm in film thickness, and the Au film is approximately 1.0 μm in film thickness.

Figure 5:
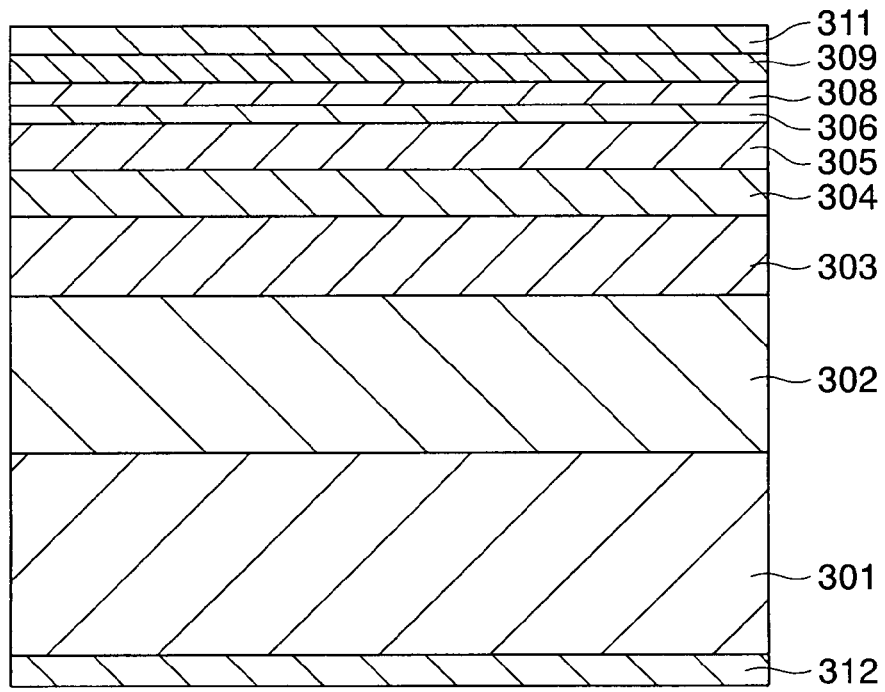
FIG. 5 is a sectional view of a semiconductor light emitting element according to a comparative example of the third embodiment.

Subsequently, a light emitting diode shown in FIG. 5 is fabricated as a comparative example. The light emitting diode in this comparative example has a configuration obtained from that of the light emitting diode in the present embodiment by forming the p-type guide layer 308 on the electron overflow prevention layer 306 without forming the concavo-convex layer 307 and forming the p-type contact layer 309 on the p-type guide layer 308.

Characteristics of the blue light emitting diode according to the present embodiment are compared with characteristics of the light emitting diode of the comparative example. In the light emitting diode of the comparative example, the operation voltage is 3.2 V and the optical output is 15 mW at an operation current of 20 mA.

On the other hand, in the light emitting diode according to the present embodiment, the operation voltage reaches 2.95 V and the optical output reaches 22 mW at an operation current of 20 mA. It is considered that the reason why the operation voltage can be lowered in the present embodiment is that the contact area between the p-type contact layer 309 and the electrode 311 is increased and hence the contact resistance is decreased as compared with the comparative example. Furthermore, diffused reflection of light at the interface between the p-type guide layer 308 formed of p-type GaN and the p-type contact layer 309 is suppressed, and consequently the optical output increases.

According to the present embodiment, the operation voltage can be lowered without damaging the active layer as heretofore described.

Fourth Embodiment

Figure 6:
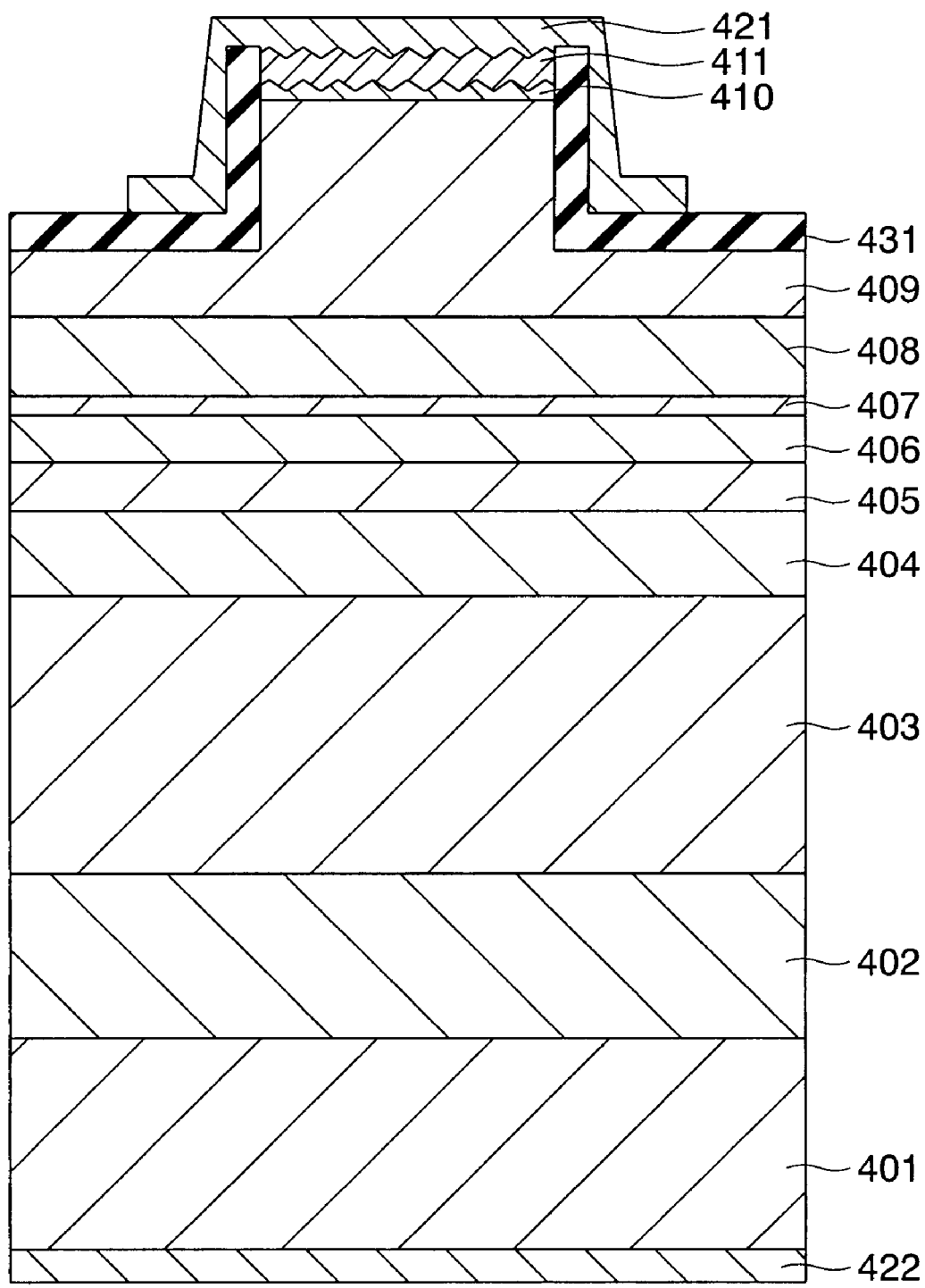
FIG. 6 is a sectional view of a semiconductor light emitting element according to a fourth embodiment.

A section of a semiconductor light emitting element according to a fourth embodiment of the present invention is shown in FIG. 6. The semiconductor light emitting element according to the present embodiment is a laser diode, which includes an n-type GaN layer 402 formed on a semiconductor substrate 401 formed of n-type GaN, an n-type cladding layer 403 formed of n-type GaAlN on the n-type GaN layer 402, an n-type guide layer 404 formed of n-type GaN on the n-type cladding layer 403, an active layer 405 having an MQW (Multiple Quantum Well) structure formed on the n-type guide layer 404, a p-type guide layer 406 formed of p-type GaN on the active layer 405, an electron overflow prevention layer 407 formed of p-type GaAlN on the p-type guide layer 406, a p-type guide layer 408 formed of p-type GaN on the electron overflow prevention layer 407, a p-type cladding layer 409 formed of p-type GaAlN on the p-type guide layer 408, a concavo-convex layer 410 formed on the p-type cladding layer 409, and a contact layer 411 formed of p-type GaN on the concavo-convex layer 410. The concavo-convex layer 410 has concave portions and convex portions which are alternately and regularly arranged at a top face thereof. In the present invention, the electron overflow prevention layer 407 is formed on the p-type guide layer 406. Alternatively, the electron overflow prevention layer 407 can be formed between the active layer 405 and the p-type guide layer 406.

A method for manufacturing the laser diode according to the present embodiment will now be described.

First, the n-type GaN layer 402 doped with an n-type impurity is formed on the semiconductor substrate 401 formed of n-type GaN by crystal growth. For the crystal growth, the MOCVD method is used. As the n-type impurity, various elements such as Si or Ge can be used. In the present embodiment, however, Si is used. The doping level of Si is set equal to approximately $2\times10^{18}$ cm$^{-3}$. In the semiconductor substrate 401 formed of n-type GaN used in the present embodiment, the above-described layers are formed on the {0001} plane. The {0001} plane should be in the range of 0° to 45° in an inclination angle into the <1-100> direction and in the range of 0° to 10° in an inclination angle into the <11-20> direction. Preferably, the {0001} plane should be in the range of 0° to 30° in an inclination angle into the <1-100> direction and in the range of 0° to 5° in an inclination angle into the <11-20> direction. More preferably, the {0001} plane should be in the range of 0° to 10° in an inclination angle into the <1-100> direction and in the range of 0° to 3° in an inclination angle into the <11-20> direction. In this case, it becomes possible to form the concavo-convex layer 410 described later in the same way as the description of the first embodiment.

Subsequently, the n-type cladding layer 403 having a layer thickness of approximately 1.5 μm doped with an n-type impurity at a doping level of approximately $1\times10^{18}$ cm$^{-3}$ is formed of $Ga_{0.95}Al_{0.05}N$ on the n-type GaN layer 402 by crystal growth.

Subsequently, the n-type guide layer 404 having a layer thickness of approximately 0.1 μm doped with an n-type impurity at a doping level of approximately $1\times10^{18}$ cm$^{-3}$ is formed of GaN on the n-type cladding layer 403 by crystal growth. The growth temperature at the time when each of the n-type GaN layer 402, the n-type cladding layer 403, and the n-type guide layer 404 is grown is in the range of 1000° C. to 1100° C. As the n-type guide layer 404, $In_{0.01}Ga_{0.99}N$ having a layer thickness of approximately 0.1 μm may be used instead of the n-type GaN. When using $In_{0.01}Ga_{0.99}N$, the growth temperature is in the range of 700° C. to 800° C.

Subsequently, the active layer 405 having an MQW (Multiple Quantum Well) structure is formed by stacking a plurality of stacked films each including a quantum well layer formed of undoped $In_{0.2}Ga_{0.8}N$ having a layer thickness of approximately 3.5 nm and barrier layers provided on both sides of the quantum well layer and each formed of undoped $In_{0.01}Ga_{0.99}N$ having a layer thickness of approximately 7 nm on the n-type guide layer 404. The growth temperature of the quantum well layer and the barriers is in the range of 700° C. to 800° C. In the design, the wavelength of photoluminescence at the room temperature is set equal to 405 nm.

Subsequently, the p-type guide layer 406 formed of GaN is grown on the active layer 405. The layer thickness should be approximately 90 nm. The temperature at which GaN is grown is in the range of 1000° C. to 1100° C. As the p-type impurity, various elements such as Mg and Zn can be used. In the present embodiment, Mg is used as the p-type impurity. The doping level of Mg should be approximately $4\times10^{18}$ cm$^{-3}$. As the p-type guide layer 406, $In_{0.01}Ga_{0.99}N$ having a layer thickness of approximately 0.1 μm may be used instead of GaN. When using $In_{0.01}Ga_{0.99}N$, the growth temperature is in the range of 700° C. to 800° C.

Subsequently, the electron overflow prevention layer 407 formed of $Ga_{0.8}Al_{0.2}N$ doped with p-type impurity at a doping level of approximately 10 nm is grown on p-type guide layer 406. The doping level of Mg as the p-type impurity should be approximately $4\times10^{18}$ cm$^{-3}$. The growth temperature of $Ga_{0.8}Al_{0.2}N$ is in the range of 1000° C. to 1100° C. but also it may be set at 700° C. to 800° C.

Subsequently, the p-type guide layer 408 formed of p-type GaN doped with Mg at a doping level of approximately $1\times10^{19}$ cm$^{-3}$ is grown on the electron overflow prevention layer 407. Its layer thickness should be approximately 50 nm. The temperature at which GaN is grown is in the range of 1000° C. to 1100° C.

Subsequently, the p-type cladding layer 409 formed of $Ga_{0.95}Al_{0.05}N$ having a layer thickness of approximately 0.6 μm doped with Mg at a doping level of approximately $1\times10^{19}$ cm$^{-3}$ is grown on the p-type guide layer 408 by crystal growth.

The concavo-convex layer 410 is formed of $In_xGa_{1-x-y}Al_yN$ (0<x<1, 0<y<1) on the p-type cladding layer 409. In the same way as the first embodiment, the growth temperature is lowered into the range of 700° C. to 800° C. again to cause growth before the formation of the concavo-convex layer 410. In the present embodiment, the concavo-convex layer 410 has a facet of one of the {1-101} plane, the {1-102} plane, the {11-21} plane and the {11-22} plane, or a plane obtained by combining them. It has been found that a composition y of Al in the concavo-convex layer 410 formed of $In_xGa_{1-x-y}Al_yN$ (0<x<1, 0<y<1) should be in the range of 0.001% to 6%, preferably in the range of 0.01% to 3%, more preferably in the range of 0.1% to 1%. The minimum layer thickness of the concavo-convex layer 410 is preferably 10 nm. The distance between a convexity and its neighboring convexity or the distance between a concavity and its neighboring concavity should be in the range of 5 nm to 100 nm, preferably in the range of 10 nm to 80 nm, more preferably in the range of 20 nm to 60 nm. The height difference from a top of a convexity to a bottom of its neighboring concavity should be in the range of 5 nm to 200 nm, preferably in the range of 5 nm to 100 nm, more preferably in the range of 5 nm to 60 nm. In the present embodiment, the lower limit of the height difference is 5 nm. This is because a large current flows through the laser and it is demanded to make the current density uniform.

Finally, the contact layer 411 formed of p-type GaN having a layer thickness of approximately 60 nm doped with Mg at a doping level of approximately $1\times10^{20}$ cm$^{-3}$ is grown on the concavo-convex layer 410. Since the layer thickness of the contact layer 411 is as thin as 60 nm, the facet and roughness of the concavo-convex layer 410 are taken over intact by the contact layer 411 as well. Therefore, the contact area between the contact layer 411 and an electrode 421 increases and the operation voltage can be lowered. In the present embodiment, the temperature at which GaN is grown is in the range of 1000° C. to 1100° C. As the contact layer 411, for example, $In_{0.01}Ga_{0.99}N$ may be used instead of the GaN. When $In_{0.01}Ga_{0.99}N$ is grown, the growth temperature is in the range of 700° C. to 800° C. In the contact layer 309 formed on a facet of one of the {1-101} plane, the {1-102} plane, the {11-21} plane and the {11-22} plane, or a plane obtained by combining them, compensation donor is hard to be formed and the acceptor concentration has risen as compared with the p-type contact layer formed on the (0001) plane even if it is doped with a p-type impurity of the same quantity. Therefore, the operation voltage can be further lowered.

In the present embodiment, concavity and convexity obtained by taking over the concavity and convexity of the concavo-convex layer 410 is formed on the surface of the p-type contact layer 411 as heretofore described. Since an etching process is not used in forming the concavity and convexity of the concavo-convex layer 410, however, the active layer is not damaged.

The laser diode is finally fabricated by conducting device processes described hereafter on the wafer subjected to the crystal growth.

As shown in FIG. 6, a stacked film including the p-type cladding layer 409, the concavo-convex layer 410 and the p-type contact layer 411 is patterned to form a ridge structure. In the ridge structure, a convex part including the p-type cladding layer 409, the concavo-convex layer 410 and the p-type contact layer 411 is formed in the center and a flat part around the convex part is formed of the p-type cladding layer 409. The convex part including the p-type cladding layer 409, the concavo-convex layer 410 and the p-type contact layer 411 extends in a direction perpendicular to the drawing paper, and forms a resonator. By the way, the section of the convex part is not restricted to a rectangle having perpendicular side walls as shown in FIG. 6, but a trapezoidal convex part having mesa-shaped slopes may be formed. The width (ridge width) of the p-type contact layer is approximately 2 μm. In the present embodiment, the resonator direction (the direction perpendicular to the drawing paper) is aligned with the <1-100> direction of the nitride III-V compound semiconductor.

A current block layer 431 formed of an insulation film is formed on the p-type cladding layer 409 serving as side faces of the convex part and the flat part around the convex part so as to sandwich the convex part between. The lateral mode is controlled by the current block layer 431. The layer thickness of the current block layer 431 can be selected arbitrarily according to the design. However, the layer thickness of the current block layer 431 should be set equal to a value in the range of approximately 0.3 µm to 0.6 µm, for example, approximately 0.5 µm. As the current block layer 431, a high resistivity semiconductor film such as an AlN film or a $Ga_{0.8}Al_{0.2}N$ film may be used. A semiconductor film irradiated with protons, a silicon oxide film ($SiO_2$ film), or a zirconium oxide film ($ZrO_2$ film) may also be used. In addition, a multilayer film including, for example, the $SiO_2$ film and the $ZrO_2$ film may also be used. In other words, as the current block layer 431, various materials can be used as long as the refractive index is lower than that of the nitride III-V compound semiconductor used in the active layer 405. It is possible to use not only the ridge waveguide type laser structure according to the present embodiment, but also the buried laser structure in which an n-type semiconductor layer such as an n-type GaN layer or an n-type GaAlN is used instead of the insulation film and a p-n junction is separated to make the n-type semiconductor layer function as a current block layer.

An electrode 421 formed of a composite film (stacked film) of, for example, palladium-platinum-gold (Pd/Pt/Au) is provided on the p-type GaN contact layer 411. For example, the Pd film is 0.05 µm in film thickness, the Pt film is 0.05 µm in film thickness, and the Au film is 1.0 µm in film thickness.

An electrode 422 formed of a composite film (stacked film) of, for example, titanium-platinum-gold (Ti/Pt/Au) is provided on the back of the semiconductor substrate 401 formed of n-type GaN. In the electrode 422, for example, the Ti film is approximately 0.05 µm in film thickness, the Pt film is approximately 0.05 µm in film thickness, and the Au film is approximately 1.0 µm in film thickness.

By the way, the resonator is formed by using cleavage. In other words, end faces of the cleavage are used as both sides of the resonator termination, and are made to function as reflection mirrors of the laser. In the present embodiment, the cleavage plane is the {1-100} plane of the nitride III-V compound semiconductor. The length of the resonator should be set equal to, for example, 600 µm.

Figure 7:
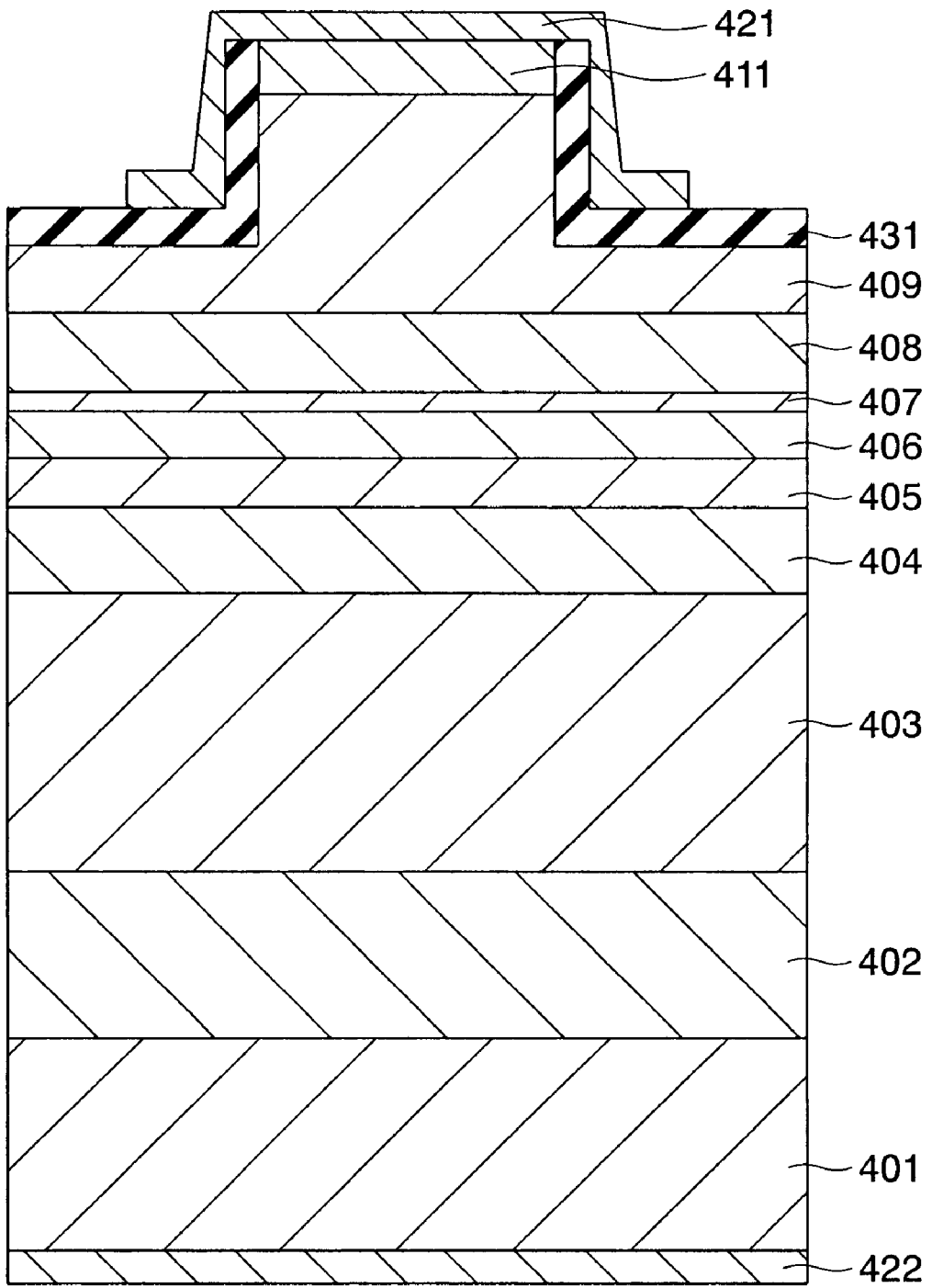
FIG. 7 is a sectional view of a semiconductor light emitting element according to a comparative example of the fourth embodiment.

Subsequently, a laser diode shown in FIG. 7 is fabricated as a comparative example. The laser diode in this comparative example has a configuration obtained from that of the laser diode in the present embodiment by growing the contact layer 411 formed of p-type GaN on the p-type cladding layer 409 formed of p-type GaAlN without forming the concavo-convex layer 410.

Characteristics of the laser diode according to the present embodiment are compared with characteristics of the laser diode of the comparative example. In the light emitting diode of the comparative example, the threshold current is 30 mA and the operation voltage at that time is 3.6 V.

On the other hand, in the laser diode according to the present embodiment, the threshold current is 30 mA and the operation voltage has become as low as 3.3 V. It is considered that the reason why the operation voltage can be lowered is that the contact area between the p-type contact layer 411 and the electrode 421 is increased and hence the contact resistance is decreased. A difference in threshold current is not found, and it is appreciated that the current can be injected uniformly regardless of whether there is the concavo-convex layer 410. The reduced operation voltage as in the present embodiment means that the power dissipation can be reduced. It is advantageous in various applications.

According to the embodiments of the present invention, the operation voltage can be lowered without damaging the active layer as heretofore described.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concepts as defined by the appended claims and their equivalents.

What is claimed is:

1. A semiconductor light emitting element comprising:
    an {0001} n-type semiconductor substrate formed of a III-V semiconductor, which is in a range of 0° to 45° in inclination angle into a <1-100> direction, and which is in a range of 0° to 10° in inclination angle into a <11-20> direction except the inclination angle of 0° in both the <1-100> direction and the <11-20> direction;
    an n-type layer formed of a III-V semiconductor on the n-type semiconductor substrate;
    an n-type guide layer formed of a III-V semiconductor above the n-type layer;
    an active layer formed of a III-V semiconductor above the n-type guide layer;
    a p-type first guide layer formed of a III-V semiconductor above the active layer;
    a p-type contact layer formed of a III-V semiconductor above the p-type first guide layer;
    a concavo-convex layer formed of $In_xGa_{1-x-y}Al_yN$ (0<x<1, 0<y<1) between the p-type first guide layer and the p-type contact layer, the concavo-convex layer having concave portions and convex portions which are alternately and regularly arranged at a top face thereof and having lower p-type impurity concentration than that of the p-type contact layer, a composition y of Al in the concavo-convex layer being in a range of 0.001% to 6%, and the height difference from a top of a convexity to a bottom of its neighboring concavity in the concavo-convex layer is in a range of 5 nm to 200 nm, wherein concave portions and convex portions are formed partly as a result of substrate orientation and without a dedicated etching step;
    a first electrode formed on the p-type contact layer and extending across the concave portions and convex portions,
    the p-type contact layer having concave portions and convex portions corresponding to the concave portions and the convex portions of the concavo-convex layer respectively, and
    the p-type contact layer and the concavo-convex layer being formed by crystal growth respectively.

2. The light emitting element according to claim 1, further comprising:
    an electron overflow prevention layer formed of a III-V semiconductor between the p-type first guide layer and the concavo-convex layer; and
    a p-type second guide layer formed of a III-V semiconductor between the electron overflow prevention layer and the concavo-convex layer.

3. The light emitting element according to claim 1, further comprising:

an electron overflow prevention layer formed of a III-V semiconductor between the p-type first guide layer and the concavo-convex layer; and a p-type second guide layer formed of a III-V semiconductor between the concavo-convex layer and the p-type contact layer.

4. The light emitting element according to claim 1, further comprising:
an electron overflow prevention layer formed of a III-V semiconductor between the active layer and the p-type first guide layer.

5. The light emitting element according to claim 1, further comprising:
a second electrode provided on one side of the n-type semiconductor substrate opposite from the n-type layer.

6. The light emitting element according to claim 1, further comprising:
a second electrode provided on the n-type layer in a region formed by removing a part of a stacked structure extending from the p-type contact layer to the n-type layer.

7. The light emitting element according to claim 1, further comprising:
an n-type cladding layer formed of a III-V semiconductor and being provided between the n-type layer and the n-type guide layer;
a p-type cladding layer formed of a III-V semiconductor and being provided between the p-type first guide layer and the concavo-convex layer, and having a convex part; and
an electron overflow prevention layer formed of a III-V semiconductor and being provided either between the active layer and the p-type first guide layer or between the p-type first guide layer and the p-type cladding layer, wherein the concavo-convex layer and the p-type contact layer are provided on a top face of the convex part of the p-type cladding layer.

8. The light emitting element according to claim 7, wherein the electron overflow prevention layer is provided between the p-type first guide layer and the p-type cladding layer, and
the semiconductor light emitting element further comprises a p-type second guide layer formed of a III-V semiconductor between the electron overflow prevention layer and the p-type cladding layer.

9. The light emitting element according to claim 7, further comprising:
a current block layer provided so as to cover side faces of the convex part of the p-type cladding layer, the concavo-convex layer, and the p-type contact layer, and cover regions of the p-type cladding layer other than the convex part; and
a second electrode on one side of the n-type semiconductor substrate opposite from the n-type layer.

10. The light emitting element according to claim 1, wherein any one of the III-V semiconductors is a nitride semiconductor.

11. The light emitting element according to claim 1, wherein the concavo-convex layer has a facet of one of a $\{1\text{-}101\}$ plane, a $\{1\text{-}102\}$ plane, a $\{11\text{-}21\}$ plane and a $\{11\text{-}22\}$ plane, or a plane obtained by combining them.

12. The light emitting element according to claim 1, wherein the distance between a convexity and its neighboring convexity or the distance between a concavity and its neighboring concavity in the concavo-convex layer is in a range of 5 nm to 100 nm.

13. The light emitting element according to claim 1, further comprising:
a p-type cladding layer formed of a III-V semiconductor, provided between the p-type first guide layer and the concavo-convex layer, and patterned into a ridge structure having side faces.

14. The light emitting element according to claim 13, further comprising:
a current block layer disposed on the side faces of the ridge structure in contact with the p-type cladding layer and the concavo-convex layer.

15. The light emitting element according to claim 14, wherein the first electrode is disposed to overlap the p-type contact layer at the top of the ridge structure and the current block layer on the side faces of the ridge structure.

16. A semiconductor light emitting element comprising:
an $\{0001\}$ n-type semiconductor substrate formed of a III-V semiconductor, which is in a range of 0° to 45° in inclination angle into a <1-100> direction, and which is in a range of 0° to 10° in inclination angle into a <11-20> direction except the inclination angle of 02° in both the <1-100> direction and the <11-20> direction;
an n-type layer formed of a III-V semiconductor on the n-type semiconductor substrate;
an n-type guide layer formed of a III-V semiconductor above the n-type layer;
an active layer formed of a III-V semiconductor above the n-type guide layer;
a p-type first guide layer formed of a III-V semiconductor above the active layer;
a p-type contact layer formed of a III-V semiconductor above the p-type first guide layer;
a concavo-convex layer formed of a III-V semiconductor between the p-type first guide layer and the p-type contact layer, the concavo-convex layer having concave portions and convex portions which are alternately and regularly arranged at a top face thereof and having lower p-type impurity concentration than that of the p-type contact layer, wherein concave portions and convex portions are formed partly as a result of substrate orientation and without a dedicated etching step;
an electrode formed on the p-type contact layer and extending across the concave portions and convex portions,
the p-type contact layer having concave portions and convex portions corresponding to the concave portions and the convex portions of the concavo-convex layer respectively, and
the p-type contact layer and the concavo-convex layer being formed by crystal growth respectively.

* * * * *